(12) United States Patent
Wang (10) Patent No.: US 9,037,309 B2
(45) Date of Patent: May 19, 2015

(54) RACK SERVER SYSTEM AND OPERATING METHOD THEREOF

(71) Applicants: Inventec (Pudong) Technology Corporation, Shanghai (CN); Inventec Corporation, Taipei (TW)

(72) Inventor: Hao-Hao Wang, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 330 days.

(21) Appl. No.: 13/789,791

(22) Filed: Mar. 8, 2013

(65) Prior Publication Data

US 2014/0088788 A1    Mar. 27, 2014

(30) Foreign Application Priority Data

Sep. 26, 2012  (CN) .......................... 2012 1 0364414

(51) Int. Cl.
| | | |
|---|---|---|
| G05D 23/00 | (2006.01) | |
| H05K 7/14 | (2006.01) | |
| H05K 7/20 | (2006.01) | |

(52) U.S. Cl.
CPC .......... *H05K 7/1498* (2013.01); *H05K 7/20836* (2013.01)

(58) Field of Classification Search
None
See application file for complete search history.

(56) References Cited

U.S. PATENT DOCUMENTS

| | | | |
|---|---|---|---|
| 8,838,286 B2 | 9/2014 | Florez-Larrahondo et al. | |
| 2009/0031051 A1* | 1/2009 | Nguyen | .......................... 710/15 |
| 2012/0116595 A1* | 5/2012 | Mizuno et al. | ................. 700/277 |
| 2012/0136484 A1 | 5/2012 | Wang et al. | |

FOREIGN PATENT DOCUMENTS

| | | |
|---|---|---|
| CN | 102469740 A | 5/2012 |
| TW | 201222265 A | 6/2012 |

OTHER PUBLICATIONS

English translation of abstract of TW 201222265 A (published Jun. 1, 2012).
English translation of abstract of CN 102469740 A (published May 23, 2012).

* cited by examiner

*Primary Examiner* — Sean Shechtman
(74) *Attorney, Agent, or Firm* — McClure, Qualey & Rodack, LLP (57) ABSTRACT

A rack server system and an operating method thereof are disclosed herein. The rack server system includes a rack, a rack management controller, a plurality of servers, a plurality of fan modules, and a plurality of fan controllers. The rack management controller includes a plurality of different first bus ports, and the fan controllers are connected to the first bus ports separately. Each of the fan controllers includes a plurality of different second bus ports, and the servers are connected to the second bus ports separately. The rack management controller identifies the fan controllers through the first bus port, and acquires server general positions of the servers inside the rack through the difference between the first bus ports and the difference between the second bus ports.

10 Claims, 2 Drawing Sheets

RACK SERVER SYSTEM AND OPERATING METHOD THEREOF

RELATED APPLICATIONS

This application claims priority to China Application Ser. No. 201210364414.3, filed Sep. 26, 2012.

BACKGROUND

1. Field of Invention

The invention is generally directed to a server system and an operating method thereof. More particularly, the invention is directed to a rack server system and an operating method thereof.

2. Description of Related Art

As is known, servers for storing data, maintaining network operation and providing various network services are becoming more and more important. A rack server system with the architecture that a plurality of servers are laminated in a rack has already been widely applied in room equipment of for example an enterprise, an organization or a data center since the rack server system has features of convenient management and centralized heat dissipation.

Generally, a rack server system separately positions the internal devices of the rack server system through hardware. For example, a plurality of pins are arranged on a backboard of the rack server system, and thus when the internal devices are inserted into the rack of the rack server system, the rack server system can acquire the positions of the internal devices on the rack through the pins contacted by the internal devices. However, if it is desired to apply the method of positioning the internal devices of the rack server system through the hardware in a large-capacity rack server system. However, the amount of the hardware needed will generally be increased accordingly, which increases the system costs. Additionally, since the known contact hardware can be easily damaged, or poor contact is caused by surface metal oxidation thereof, errors frequently result for the positioning in the rack server system, which leads to instability of the rack server system.

Therefore, a novel method to replace the conventional method, which positions the internal devices of the rack server system through the hardware is desired.

SUMMARY

In accordance with an aspect of the invention, a rack server system is provided, which can use a rack management controller inside the rack server system to position other internal devices included in the rack server system.

According to an embodiment of the invention, the rack server system includes a rack, a rack management controller, a plurality of server groups, a plurality of fan modules and a plurality of fan controllers. The rack management controller includes a plurality of different first bus ports. Each of the server groups includes a plurality of server. Each of the fan modules dissipates heat for one of the server groups. Each of the fan controllers collects running information of corresponding servers in the corresponding server group and controls an operation of the corresponding fan module accordingly, and each of fan controllers includes a plurality of different second bus ports. In each of the server groups, each of the servers is connected to the second bus ports of the corresponding fan controller through second buses. The servers communicate with the corresponding fan controller using a same second bus address. Each of the second bus ports corresponds to a different server position in the rack. These fan controllers communicate with the servers through these second bus ports, and acquire the server local positions in the rack of the servers through the difference between the second bus ports through which the communication data is transmitted. Each of the fan controllers is connected to the first bus ports through first buses, the fan controllers communicate with the rack management controller using a same first bus address, and each of the first bus ports corresponds to a different fan controller position in the rack. The rack management controller is used to communicate with the fan controllers through the first bus ports, acquire fan controller positions in the rack of the fan controllers through the difference between the first bus ports through which the communication data is transmitted, and acquire server local positions in the rack of the servers through the fan controllers, so as to acquire the server general positions in the rack of the servers.

According to an embodiment of the invention, the rack comprises a plurality of rack layers, each of the rack layers correspond to one of the servers, the rack layers corresponding to the servers in the same server group are adjacent to each other; one of the fan controllers corresponding to one of the server group collects running information of the servers of the one of the server groups through the corresponding second buses to control the corresponding fan module to dissipate heat for the space of the rack layers corresponding to the servers of the one of the server groups; and the one of the fan controllers acquires the server local positions in the rack of the servers of the one of the server groups sending the running information thereof through the second bus ports through which the running information of the servers of the one of the server groups passes.

According to an embodiment of the invention, the server positions in the rack correspond to the rack layers; each of the rack layers corresponds to one of the second bus ports; the rack management controller allocates server serial numbers to the second bus ports according to the rack layers correspond to the second bus ports; and when one of the server is connected to one of the second bus port through the corresponding second bus, the corresponding fan controller assigns a corresponding server serial number to the one of the server.

According to an embodiment of the invention, the fan controllers further transmit the running information of the servers and the server local positions in the rack of the servers to the rack management controller through the first buses. The rack management controller acquires the fan controller positions in the rack of one of the fan controllers sending the running information and the server local positions in the rack of the corresponding servers through the first bus ports through which the running information and the server local positions in the rack of the corresponding servers pass.

According to an embodiment of the invention, the rack management controller sequentially allocates a plurality of fan controller serial numbers to the fan controllers connected with the first bus ports according to the connection of the first bus ports.

Another embodiment of the invention provides an operating method of a rack server system. According to an embodiment of the invention, The operating method includes: providing a rack, comprising a plurality of fan controller positions and a plurality of server positions; providing a rack management controller which comprising a plurality of different first bus ports; defining each first bus port associated separately with one of the fan controller positions in the rack; providing a plurality of server groups, set in these server positions, each server group comprising a plurality of servers; providing a plurality of fan modules, each fan module operative to dissipate heat for one of the server groups; providing a plurality of fan controllers, set in these fan controller positions, each fan controller collecting running information of servers in a corresponding one of the server groups and controlling an operation of a corresponding one of the fan modules accordingly, and each fan controller comprising a plurality of different second bus ports; defining each second bus port associated separately with one of the server positions in the rack; linking the second bus ports of each fan controller with the servers in a corresponding one of the server groups, separately through a second bus according to the defined association; communicating, using the fan controllers, with the servers through the second bus ports and the fan controllers; acquiring, using the fan controllers, server local positions in the rack of corresponding servers through the difference between the second bus ports through which the communication data is transmitted; linking the first bus ports of the rack management controller with the fan controllers separately through a first bus according to the defined association; communicating, using the rack management controller, with the fan controllers through the first bus ports; acquiring, using the rack management controller, fan controller positions in the rack of the fan controllers through a difference between the first bus ports through which the communication data is transmitted; and, the rack management controller acquires the server local positions in the rack of the servers from the fan controllers and acquires the server general positions in the rack of the servers according to the fan controller positions in the rack of the fan controllers and the server local positions in the rack of the servers.

According to an embodiment of the invention, wherein the rack includes a plurality of rack layers, each of the rack layers correspond to one of the servers, the rack layers corresponding to the servers in the same server group are adjacent to each other, and the operating method further includes: one of the fan controllers corresponding to one of the server group collects running information of the servers of the one of the server groups through the corresponding second buses to control the corresponding fan module to dissipate heat for the rack space of the rack layer corresponding to the servers of the one of the server group; and the one of the fan controllers acquires the server local positions in the rack of the servers of the one of the server groups sending the running information thereof according to the second bus ports through which the running information of the servers of the one of the server groups passes.

According to an embodiment of the invention, the server positions in the rack correspond to the rack layers, each of the rack layers corresponds to one of the second bus ports, and the operating method includes: the rack management controller allocates server serial numbers to the second bus ports according to the rack layers correspond to the second bus ports; and when one of the servers is linked to one of the second bus ports through the corresponding second bus, the corresponding fan controller assigns the corresponding server serial number to the one of the server.

According to an embodiment of the invention, the operating method further includes: the fan controllers transmit the running information of the servers and the server local positions in the rack of the servers to the rack management controller through the first buses; and the rack management controller acquires the fan controller position in the rack of one of the fan controllers sending the running information and the server local positions in the rack of the corresponding servers according to the first bus ports through which the running information and the server local positions in the rack of the corresponding servers pass.

According to an embodiment of the invention, the operating method further includes: the rack management controller sequentially allocates a plurality of fan controller serial numbers to the fan controllers linked with the first bus ports according to the connection between the fan controllers and the first bus ports.

In view of the above, when the fan controllers are connected or linked with the first bus ports of the rack management controller separately, and the servers are connected with the fan controllers separately, the rack management controller can identify the fan controllers by the first and second bus ports, so as to achieve the positioning function. Through such an arrangement, it can be avoided to use contact hardware to perform positioning, which can simplify the hardware structure, reduce the cost, and can further improve the stability of the rack server system and reduce the inconvenience for managers in repairing the damaged contact hardware.

BRIEF DESCRIPTION OF THE DRAWINGS

In order to make the foregoing as well as other aspects, features, advantages, and embodiments of the invention more apparent, the accompanying drawings are described as follows.

DETAILED DESCRIPTION

The spirit of the disclosure will be described clearly through the drawings and the detailed description as follows. Persons of ordinary skill in the art will appreciate modifications and variations from the technology taught in the disclosure, based on the following description without departing from the sprite and scope of the disclosure.

An aspect of the invention provides a rack server system, which can use a rack management controller inside the rack server system to position other internal devices included in the rack server system.

Figure 1:
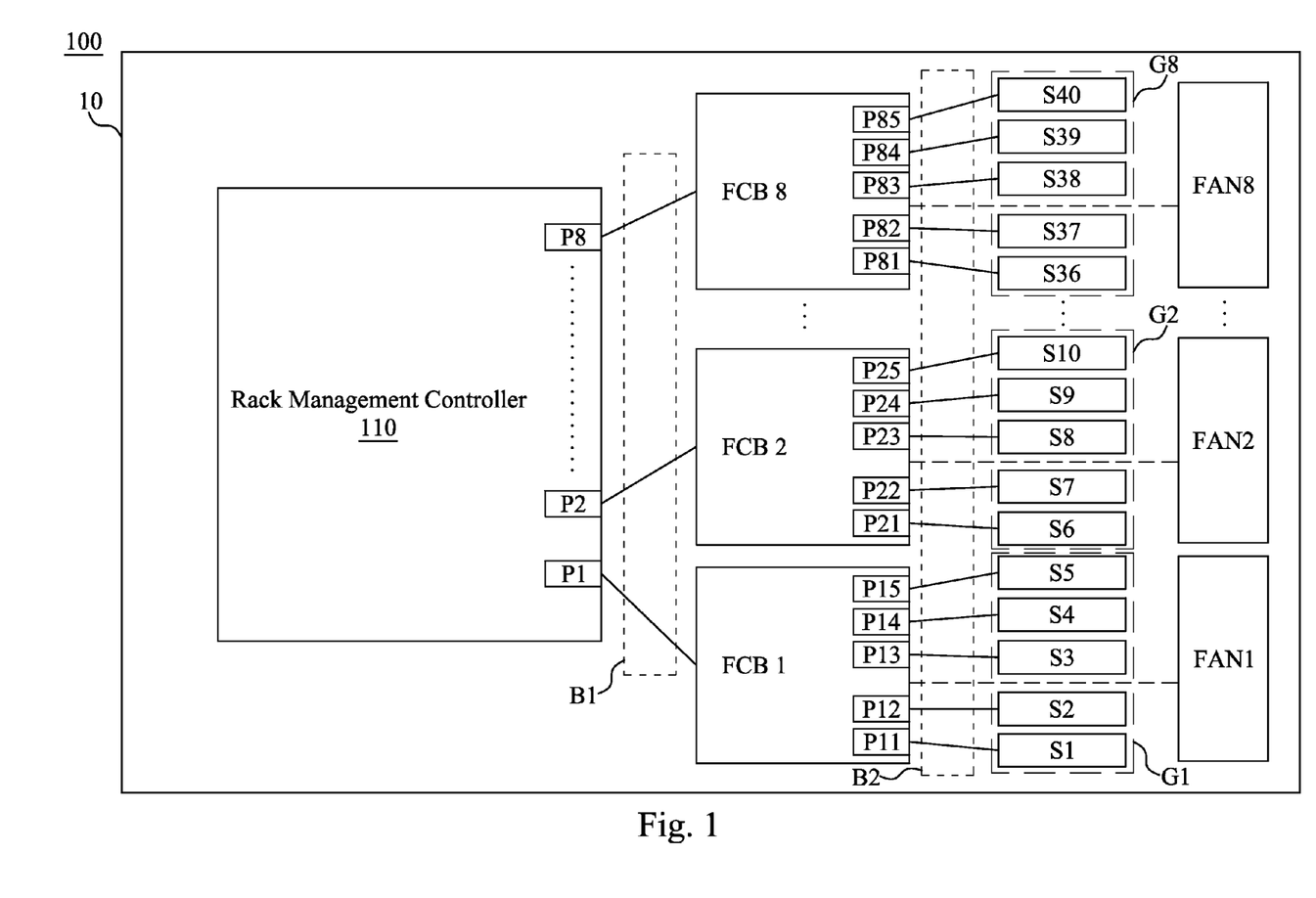
FIG. 1 is a schematic view of a rack server system illustrated according to an embodiment of the invention.

FIG. 1 is a schematic view of a rack server system illustrated according to an embodiment of the invention. The rack server system 100 at least includes a rack 10, a rack management controller 110, a plurality of fan controllers FCB1-FCB8, a plurality of servers S1-S40 and a plurality of sets of fan modules FAN1-FANS. The servers S1-S40 may be divided into a plurality of server groups. For example the servers S1-S40 are divided into server groups G1-G8, wherein S1-S5 may be classified into the server group G1, S5-S10 may be classified into the server group G2, and so on.

It should be noted that, for convenience of description, the number of each of the fan modules, fan controllers and first bus ports in the disclosure is 8 per set, for example, the number of the second bus ports is 40, for example, and the number of the servers is 40 and the servers are divided into 8 sets, for example. However, the number of these components can be adjusted according to actual conditions or other desired reasons, which is not limited to the numbers mentioned above. Furthermore, in other embodiments, the number of the fan controllers may be smaller than the number of the first bus ports, and the number of the servers may be smaller than the number of the second bus ports.

The rack management controller 110, the fan controllers FCB1-FCB8, the servers S1-S40 and the fan modules FAN1-FAN8 may be separately disposed in the rack 10. For example, the fan controllers FCB1-FCB8 may be separately disposed at different fan controller positions (e.g., fan controller sockets) in the rack 10, and the servers S1-S40 may be separately disposed at different server positions (e.g., server sockets) in the rack 10.

The fan controllers FCB1-FCB8 are separately connected to the fan modules FAN1-FAN8. Each of the fan controllers FCB1-FCB8 collects running information of the servers S1-S40 in a corresponding one of the server groups G1-G8 and controls a corresponding one of the fan modules FAN1-FAN8 to operate accordingly. For example, the fan controller FCB1 controls the fan module FAN1 to operate, and the fan controller FCB2 controls the fan module FAN2 to operate. Each of the fan modules FAN1-FAN8 dissipates heat for corresponding ones of servers S1-S40 in a corresponding one of the server groups G1-G8. For example, the fan module FAN1 dissipates heat for the corresponding servers S1-S5 in the server group G1, and the fan module FAN2 dissipates heat for the corresponding servers S6-S10 in the server group G2.

The rack management controller 110 includes a plurality of different first bus ports P1-P8, and the first bus ports P1-P8 separately correspond to different fan controller positions. The first bus ports P1-P8 are connected with the fan controllers FCB1-FCB8 separately through first buses B1. The fan controllers FCB1-FCB8 communicate with the corresponding fan controller using a same first bus address. The rack management controller 110 is used to transmit data through the first bus ports P1-P8 and the fan controllers FCB1-FCB8. For example, a fan rotating speed table and state messages of the fan controller FCB2 can be transmitted to the rack management controller 110 through the corresponding first bus port P2. Similarly, the rack management controller 110 can also transmit a control command (e.g., a command related to rotating speed) to the corresponding fan controller FCB2 through the corresponding first bus port P2. The rack management controller 110 acquires the fan controller positions in the rack 10 of the fan controllers FCB1-FCB8 through the difference between the first bus ports P1-P8 connected with the fan controllers FCB1-FCB8. That is, the rack management controller 110 acquires the fan controller positions in the rack 10 of the fan controllers FCB1-FCB8 through the difference between the first bus ports through which the communication data is transmitted. In other words, the rack management controller 110 can identify the fan controllers FCB1-FCB8 through the first bus ports P1-P8. For example, when the fan controller FCB2 transmits data to the rack management controller 110, the rack management controller 110 can acknowledge that the communication data is transmitted by the fan controller connected to the first bus port P2 through the source of the data (e.g., the first bus port P2).

Each of the fan controllers FCB1-FCB8 collects the running information of corresponding ones of servers S1-S40 in a corresponding one of the server groups G1-G8 and controls a corresponding one of the fan modules FAN1-FAN8 to operate accordingly.

Each of the fan controllers FCB1-FCB8 includes a plurality of different second bus ports. For example, the fan controller FCB1 includes the second bus ports P11-P15, the fan controller FCB2 includes the second bus ports P21-P25, and so on. The second bus ports P11-P85 of the fan controllers FCB1-FCB8 are connected with the servers S1-S40 separately. For example, the second bus ports P11-P15 of the fan controller FCB1 are connected to servers S1-S5 (i.e., the server group G1) separately, and the second bus ports P21-P25 of the fan controller FCB2 are connected to servers S6-S10 (i.e., the server group G2) separately. The servers S1-S40 communicate with the fan controllers FCB1-FCB8 using a same second bus address. The fan controllers FCB1-FCB8 transmit data separately through the second bus ports P11-P85 and the servers S1-S40. For example, the servers S1-S40 can transmit temperatures and state messages of themselves to the corresponding fan controllers FCB1-FCB8 through the second bus ports P11-P85. Each of the fan controllers FCB1-FCB8 acquires the server local positions in the rack 10 (e.g., the information of physical position arrangement) of the corresponding servers S1-S40 in a corresponding one of the server groups G1-G8 through the difference between the second bus ports P11-P85 connected with the corresponding one of the server groups G1-G8. That is, the fan controllers FCB1-FCB8 acquire the server local positions in the rack 10 of corresponding servers S1-S40 through the difference between the second bus ports P11-P85 through which the communication data is transmitted, in which the server local positions can indicate relative positions of the corresponding servers S1-S40 in the corresponding one of the server groups G1-G8 where the corresponding one of the fan controllers FCB1-FCB8 can acknowledge. In other words, the fan controllers FCB1-FCB8 can use the second bus ports P11-P85 to identify the servers S1-S40. For example, when the server S7 transmits data to the fan controller FCB2, the fan controller FCB2 can acknowledge that the communication data is transmitted by the server connected with the second bus port P22 through the source of the data (e.g., the second bus port P22).

The rack management controller 110 can acknowledge the server local positions (e.g., the information of physical position arrangement) in the rack 10 of the corresponding servers S1-S40 in the server groups G1-G8 through the fan controllers FCB1-FCB8, and acknowledge the server general positions (e.g., the information of physical positions) in the rack 10 of the servers S1-S40 according to the fan controller positions of the fan controllers FCB1-FCB8 in the rack 10 and the server local positions (e.g., the information of physical position arrangement) in the rack 10 of the corresponding servers S1-S40 in the server groups G1-G8, in which the server general positions in the rack 10 of the servers S1-S40 can indicate general positions of the servers S1-S40 in the rack 10. In other words, the rack management controller 110 can use the first bus ports P1-P8 and the second bus ports P11-P85 to identify the servers S1-S40. For example, when the server S6 transmits data to the rack management controller 110, the rack management controller 110 can acknowledge that the communication data is transmitted through the fan controller FCB2 since the data is sourced from the first bus port P2, and can acknowledge that the server transmitting the data is connected to the second bus port P21 of the fan controller FCB2 since the data is sourced from the second bus port P21.

The prior art mainly uses hardware to position internal devices (such as servers or fan controllers) of the rack server system. Furthermore, the rack server system of the prior art is mainly the connection architecture formed by connecting multiple internal devices (such as servers or fan controllers) through a single bus (i.e., a bus topology). However, with such architecture, the master control device (such as the rack management controller or the fan controller) cannot position the slave devices (such as the fan controllers or the servers) only through the bus or bus communication.

The embodiments of the invention, in contrast with the priori art, the rack management controller 110 is connected to the fan controllers FCB1-FCB8 separately through the first bus ports P1-P8. Therefore, the rack management controller 110 can identify the fan controllers FCB1-FCB8 connected to different first bus ports P1-P8 through the first bus ports P1-P8. Furthermore, the fan controllers FCB1-FCB8 are connected to the servers S1-S40 through the second bus ports P11-P85, so that a corresponding one of the fan controllers FCB1-FCB8 can identify the servers S1-S40 connected to different second bus ports P11-P85 through the second bus ports P11-P85. As such, even without using additional hardware, the rack management controller 110 can also identify different internal devices (such as servers or fan controllers) of the rack server system, so as to achieve the positioning function.

In an embodiment of the invention, during data transmission, if the rack management controller 110 receives data, then the rack management controller 110 can acknowledge the source of the data according to the first bus ports P1-P8 and second bus ports P11-P85 through which the data passes, i.e., the server general position in the rack of the server transmitting the data.

In an embodiment of the invention, the rack management controller 110 can sequentially allocate fan controller serial numbers to the fan controllers FCB1-FCB8 connected with the first bus ports P1-P8 according to the connection between the fan controllers FCB1-FCB8 and the first bus ports P1-P8. For example, the rack management controller 110 can allocate different fan controller serial numbers (such as serial numbers 1-8) separately to the fan controllers FCB1-FCB8 connected with the first bus ports P1-P8. That is, when a new added fan controller is connected to one of the first bus ports P1-P8, a fan controller serial number is assigned to the newly added fan controller (for example, the rack management controller 110 can transmit specific information to the new added fan controller so as to assign a fan controller serial number thereto). Also for example, the rack management controller 110 can define the fan controllers FCB1-FCB8 connected with the first bus ports P1-P8 separately with different fan controller serial numbers (such as serial numbers 1-8), wherein for example the information from the first bus port P2 is defined as the information coming from a fan controller marked with the fan controller serial number 2, and if the rack management controller 110 wants to transmit a control command to the fan controller marked with the fan controller serial number 2, then the rack management controller 110 transmits the control command through the first bus port P2. The manner of allocating the fan controller serial numbers is only described as an example, but an actual allocating manner is not limited to the above examples.

Through the arrangement described above, the fan controllers FCB1-FCB8 can be sequenced according to the first bus ports P1-P8 connected therewith. Furthermore, if the first bus ports P1-P8 connected with the fan controllers FCB1-FCB8 correspond to the physical positions of the fan controllers FCB1-FCB8 (such as the fan controller positions or the physical position of the fan controllers in the rack along a height direction) in the rack server system 100, then the fan controllers FCB1-FCB8 may be sequenced according to the positions thereof in the rack server system 100. For example, if the fan controller (e.g., FCB1) positioned at the lowest layer of the rack server system 100 is connected with the first bus port P1, the fan controller (e.g., FCB2) positioned at the secondly lowest layer of the rack server system 100 is connected with the first bus port P2, and so on, then the fan controller serial numbers can be assigned to the fan controllers FCB1-FCB8 according to the positions of the fan controllers FCB1-FCB8 in the rack server system 100, so that it is convenient for maintainers to identify, repair or change the fan controllers FCB1-FCB8.

Furthermore, in some embodiments, the rack management controller 110, or a corresponding one of the fan controllers FCB1-FCB8, can also sequentially allocate server serial numbers to the servers S1-S40 according to the connection between the servers S1-S40 and the second bus ports P11-P85. For example, the rack management controller 110 or the fan controller FCB2 can allocate different server serial numbers (such as serial numbers 6-10) separately to the servers S6-S10 connected with the second bus ports P21-P25. That is, when a new added server is connected to one of the second bus ports P21-P25, the rack management controller 110 or the fan controller FCB2 can assign a server serial number to the new added server according to the fan control serial number of the fan controller FCB2 and the port position of the second bus port connected with the new added server (for example, the rack management controller 110 or the fan controller FCB2 can transmit specific information to the new added server to assign a server serial number thereto). Also for example, the rack management controller 110 or the fan controller FCB2 can define the servers S1-S40 connected with the second bus ports P21-P25 separately with different server serial numbers (such as serial numbers 1-40) according to the fan control serial number of the fan controller FCB2, wherein for example the information from the second bus port P22 is defined as the information coming from the server marked with the server serial number 7, and if the rack management controller 110 or the fan controller FCB2 wants to transmit a control command to the server marked with the server serial number 7, then the rack management controller 110 or the fan controller FCB2 can transmit the control command through the second bus port P22. It should be noted that, the manner of allocating the server serial numbers is only described as an example, but an actual allocating manner is not limited to the above examples.

Through the arrangement described above, the servers S1-S40 can be sequenced according to the second bus ports P11-P85 connected therewith.

Moreover, the rack 10 of the rack server system 100 may be provided with a plurality of server sockets and a plurality of rack layers separately corresponding to the plurality of server sockets. Each of the server sockets and rack layers can be installed with one server. The server sockets can be arranged from high to low or from low to high.

The servers S1-S40 may separately correspond to rack layers. That is, the servers S1-S40 can be separately installed in server sockets correspond to rack layers. The rack layers corresponding to the servers S1-S5, S6-S10 . . . or S36-S40 of the same one of the server groups G1-G8 are adjacent to each other. That is, the servers S1-S5, S6-S10 . . . or S36-S40 of the same one of the server groups G1-G8 can be installed in adjacent server sockets. For example, the servers S1-S5 corresponding to the server group G1 may be installed in adjacent server sockets, and the servers S6-S10 corresponding to the server group G2 may be installed in adjacent server sockets.

In some embodiments, the server groups G1-G8 correspond to the fan controllers FCB1-FCB8 separately, and the server serial numbers of the servers S1-S40 correspond to different heights (such as the rack layers) separately. That is, the servers S1-S40 may be installed in server sockets according to the server serial numbers thereof, and as a result, to be disposed at different heights.

In some embodiments, the server serial numbers of the servers S1-S40 may correspond to the space of different rack layers separately. That is, the servers S1-S40 may be installed in server sockets corresponding to the rack layers according to the server serial numbers thereof. For example, the server marked with the server serial number 1 may be installed in a server socket corresponding to a first rack layer, and the server marked with the server serial number 2 may be installed in a server socket corresponding to a second rack layer. As such, the servers S1-S40 may be installed in the server sockets corresponding to the rack layers from high to low or from low to high according to the server serial numbers, so that it is convenient for maintainers to identify, repair and change the servers S1-S40.

In an embodiment, one of the fan controllers FCB1-FCB8 corresponding to one of the server groups G1-G8 can collect running information of the servers S1-S40 of the one of the server groups G1-G8, so as to respectively control the corresponding fan modules FAN1-FAN8 to dissipate heat for the rack space of the rack layers corresponding to the servers S1-S40 of the one of the server groups G1-G8 in the rack 10. The one of the fan controllers FCB1-FCB8 acquires the server local positions (e.g., the information of physical position arrangement) in the rack 10 of the servers S1-S40 of the one of the server groups G1-G8 sending the running information of the servers S1-S40 through the second bus ports P11-P85 through which the running information of the servers S1-S40 of the one of the server groups G1-G8 passes.

In an embodiment, the different server positions in the rack 10 are corresponding to the rack layers of the rack 10. Each of the rack layers corresponds to one of the second bus ports P11-P85. The rack management controller 110 allocates server serial numbers related to the rack layers to the second bus ports P11-P85. When one of the servers S1-S40 is connected to one of the second bus ports P11-P85 through the second bus B2, the corresponding one of the fan controllers FCB1-FCB8 assigns a corresponding server serial number to the one of the servers S1-S40.

In an embodiment, the fan controllers FCB1-FCB8 further transmit the running information and the server local positions in the rack 10 of the servers S1-S40 to the rack management controller 110 through the first buses B1; and the rack management controller 110 acknowledges the fan controller position in the rack 10 of one of the fan controllers FCB1-FCB8 sending the running information and server local positions in the rack 10 of the corresponding servers S1-S40 through the corresponding first bus ports P1-P8 through which the running information and the server local positions in the rack 10 of the corresponding servers S1-S40 pass.

In the previous architecture, the first bus ports P1-P8 of the rack management controller 110 can separately connect with the fan controllers FCB1-FCB8 in a one-to-one correspondence through the buses (star bus topology). Additionally, the second bus ports P11-P85 of the fan controllers FCB1-FCB8 may also separately connect with the servers S1-S40 one to one through the buses (star bus topology).

Furthermore, the first bus ports P1-P8 which connect the rack management controller 110 and the fan controllers FCB1-FCB8, and/or the second bus ports P11-P85 which connect the fan controllers FCB1-FCB8 and the servers S1-S40 may be RS-485 cables or I²C bus communication ports arranged on the backboard (not shown) of the rack server system 100, so as to avoid increasing the complexity of the connection lines in the rack server system 100 and the cost. However, the first bus ports P1-P8 and the second bus ports P11-P85 may also be realized through communication ports with other specifications or standards, not limited to those mentioned above.

Additionally, the rack management controller 110, the fan controllers FCB1-FCB8 and the servers S1-S40 may separately be different chips, integrated circuits, programmable logic devices or other control devices having calculating and storing functions, or other devices coming into minds of those skilled in the art.

Another aspect of the invention provides an operating method of a rack server system, which can be applied but not limited to the rack server system as shown in FIG. 1. For convenience of clear description, the operating method of the rack server system is described hereafter by taking the rack server system shown in FIG. 1 as an example.

Figure 2:
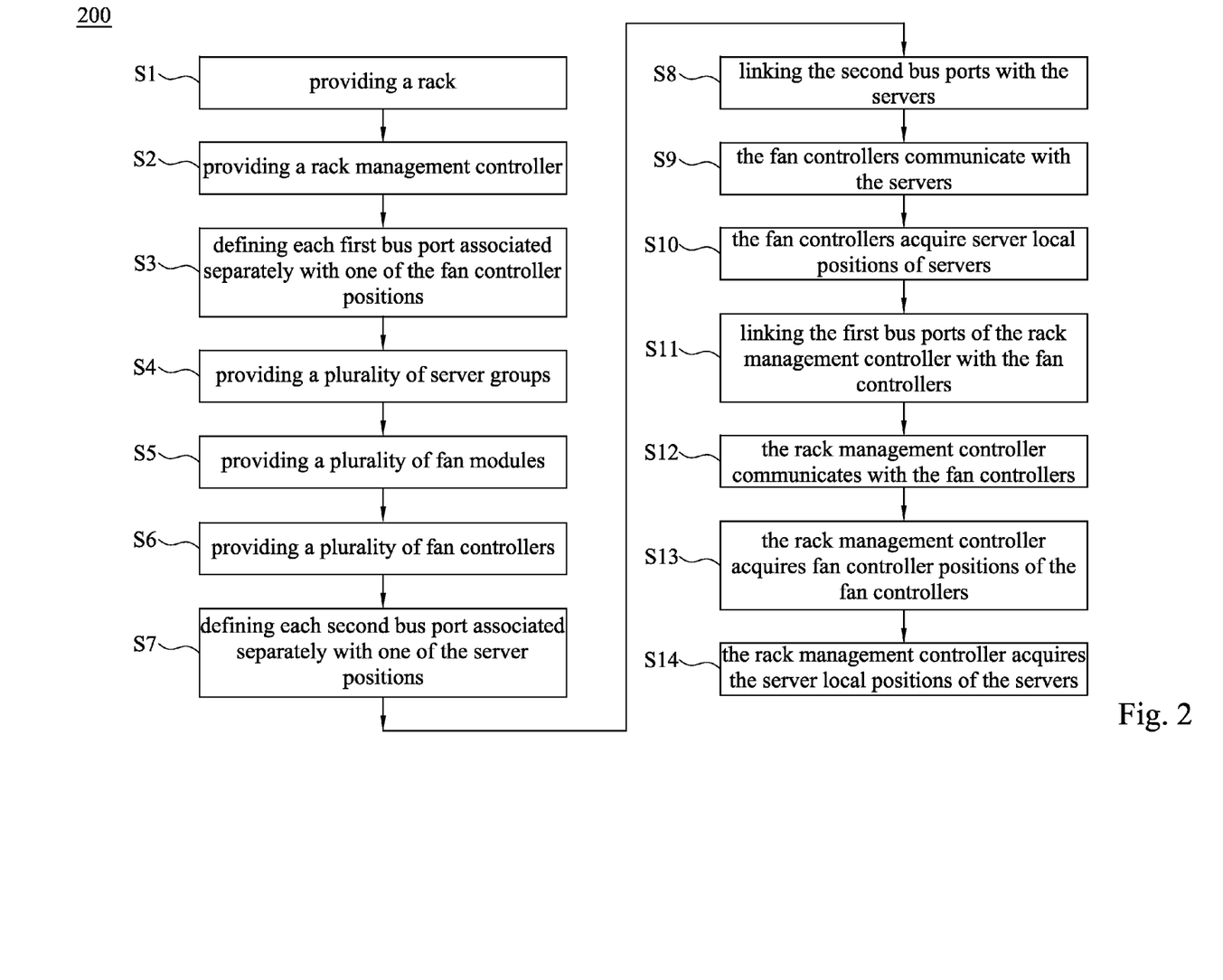
FIG. 2 is a flowchart of an operating method illustrated according to an embodiment of the invention.

FIG. 2 is a flowchart of an operating method 200 illustrated according to an embodiment of the invention. In the embodiment of the invention, the operating method 200 at least includes: providing a rack 10, including a plurality of fan controller positions and a plurality of server positions (S1); providing a rack management controller 110 which comprising a plurality of different first bus ports P1-P8 (S2); defining each first bus port P1-P8 associated separately with one of the fan controller positions in the rack 10 (S3); providing a plurality of server groups G1-G8, set in these server positions, each server group G1-G8 comprising a plurality of servers S1-S40 (S4); providing a plurality of fan modules FAN1-FANS, each fan module FAN1-FAN8 operative to dissipate heat for one of the server groups G1-G8 (S5); providing a plurality of fan controllers FCB1-FCB8, set in these fan controller positions, each fan controller FCB1-FCB8 collecting running information of servers S1-S40 in a corresponding one of the server groups G1-G8 and controlling an operation of a corresponding one of the fan modules FAN1-FAN8 accordingly, and each fan controller FCB1-FCB8 including a plurality of different second bus ports P11-P85 (S6); defining each second bus port P11-P85 associated separately with one of the server positions in the rack 10 (S7); linking the second bus ports P11-P85 of each fan controller FCB1-FCB8 with the servers S1-S40 in a corresponding one of the server groups G1-G8, separately through a second bus B2 according to the defined association (herein the connection may be a physical line connection or established link on software) (S8); communicating, using the fan controllers FCB1-FCB8, with the servers S1-S40 through the second bus ports P11-P85 and the fan controllers FCB1-FCB8 (S9); acquiring, using the fan controllers FCB1-FCB8, server local positions in the rack 10 of corresponding servers S1-S40 through the difference between the second bus ports through which the communication data is transmitted (S10), and that is, the rack management controller 110 acquires the fan controller positions of the fan controllers FCB1-FCB8 in the rack server system 100 through the difference between the first bus ports P1-P8 connected/linked with the fan controllers FCB1-FCB8, in which the server local positions can indicate relative positions of the corresponding servers S1-S40 in the corresponding one of the server groups G1-G8 where the corresponding one of the fan controllers FCB1-FCB8 can acknowledge, and in other words the rack management controller 110 identifies fan controllers FCB1-FCB8 through the first bus ports P1-P8; linking the first bus ports P1-P8 of the rack management controller 110 with the fan controllers FCB1-FCB8 separately through a first bus B1 according to the defined association (S11); communicating, using the rack management controller 110, with the fan controllers FCB1-FCB8 through the first bus ports P1-P8 (S12); acquiring, using the rack management controller 110, fan controller positions in the rack 10 of the fan controllers FCB1-FCB8 through a difference between the first bus ports P1-P8 through which the communication data is transmitted (S13), and that is each of the fan controllers FCB1-FCB8 acquires the server local position in the rack 10 of corresponding ones of the servers S1-S40 in a corresponding one of the server groups G1-G8 through the difference between the second bus ports P11-P85 connected/linked with the corresponding one of the server groups G1-G8, and in other words, the fan controllers FCB1-FCB8 identify the servers S1-S40 through the second bus ports P11-P85; the rack management controller 110 acquires the server local positions in the rack 10 of the servers S1-S40 from the fan controllers FCB1-FCB8 and acquires the server general positions in the rack 10 of the servers S1-S40 according to the fan controller positions in the rack 10 of the fan controllers FCB1-FCB8 and the server local positions in the rack 10 of the servers S1-S40 of the server groups G1-G8 (S14), in which the server general positions in the rack 10 of the servers S1-S40 can indicate general positions of the servers S1-S40 in the rack 10, and in other words, the rack management controller 110 identifies the servers S1-S40 through the first bus ports P1-P8 and the second bus ports P11-P85. For example, when the server S6 transmits communication data to the rack management controller 110, the rack management controller 110 can acknowledge that the communication data is transmitted through the fan controller FCB2 since the data is sourced from the first bus port P2, and can acknowledge that the server transmitting the communication data is connected/linked to the second bus port P21 of the fan controller FCB2 since the data is sourced from the second bus port P21.

In an embodiment of the invention, the operating method 200 further includes: during data transmission, the rack management controller 110 acknowledges the server positions of the server transmitting the data according to the first bus ports P1-P8 and the second bus ports P11-P85 through which the received data passes.

In an embodiment of the invention, the operating method 200 further includes: collecting, using one of the fan controllers FCB1-FCB8, running information of the servers S1-S40 of one of the server groups G1-G8 through the corresponding second buses B2 to control the corresponding fan modules FAN1-FAN8 to dissipate heat for the space of the rack layers corresponding to the servers S1-S40 of the one of the server groups G1-G8; and the one of the fan controllers FCB1-FCB8 acquires the server local positions in the rack 10 (e.g., the information of physical position arrangement) of the servers S1-S40 of the one of the server groups G1-G8 sending the running information of the servers S1-S40 through the second bus ports P11-P85 through which the running information of the servers S1-S40 of the one of the server groups G1-G8 passes.

In an embodiment of the invention, the operating method 200 further includes: the rack management controller 110 allocates server serial numbers related to the layer of the rack space to the second bus ports P11-P85 according to the rack layers correspond to the second bus ports; and when one of the servers S1-S40 is connected/linked to one of the second bus ports P11-P85 through the corresponding second bus B2, the corresponding one of the fan controllers FCB1-FCB8 assigns the corresponding server serial number to the one of the servers S1-S40.

In an embodiment of the invention, the operating method 200 further includes: the fan controllers FCB1-FCB8 transmit the running information of the servers S1-S40 and the server local positions in the rack 10 to the rack management controller 110 through the first bus B1; and the rack management controller 110 acquires the fan controller position in the rack 10 of one of the fan controllers FCB1-FCB8 sending the running information and the server local positions in the rack 10 through the corresponding first bus ports P1-P8 through which the running information and the server local positions in the rack 10 of the servers S1-S40 pass.

Additionally, the operating method 200 further sequentially allocates, using the rack management controller 110, fan controller serial numbers to the fan controllers FCB1-FCB8 connected/linked with the first bus ports P1-P8 according to the connection between the fan controllers FCB1-FCB8 and the first bus ports P1-P8. The details of this step can be known by referring to the related paragraphs in the previous implementing aspect, and will not be described here anymore.

Furthermore, the operating method 200 further sequentially allocates, using the rack management controller 110 or a corresponding one of the fan controllers FCB1-FCB8, server serial numbers to the servers S1-S40 according to the connection between the servers S1-S40 and the second bus ports P11-P85. The details of this step will be understood by persons skilled in the art by referring to the related paragraphs in the previous implementing aspect, and will not be described here anymore.

In the above steps, the server serial numbers of the servers S1-S40 may correspond to the space of different rack layers separately. That is, the servers S1-S40 may be installed in server sockets corresponding to the rack layers according to the server serial numbers thereof. For example, the server marked with the server serial number 1 may be installed in a server socket corresponding to a first rack layer, and the server marked with the server serial number 2 may be installed in a server socket corresponding to a second rack layer. As such, the servers S1-S40 may be installed in the server sockets corresponding to the rack layers from high to low or from low to high according to the server serial numbers, so that it is convenient for maintainers to identify, repair and change the servers S1-S40.

In the previous steps, the first bus ports P1-P8 of the rack management controller 110 may separately connected/linked with the fan controllers FCB1-FCB8 one to one through the buses (star bus topology). Additionally, the second bus ports P11-P85 of the fan controllers FCB1-FCB8 may also separately connected/linked with the servers S1-S40 one to one through the buses (star bus topology).

Compared with the prior art, as applying the operating method 200 of the embodiments of the invention, the rack management controller 110 is connected/linked to the fan controllers FCB1-FCB8 through the first bus ports P1-P8 one to one. Therefore, the rack management controller 110 can identify the fan controllers FCB1-FCB8 connected/linked to different first bus ports P1-P8 through the first bus ports P1-P8. Furthermore, the fan controllers FCB1-FCB8 are connected/linked with the servers S1-S40 through the second bus ports P11-P85 one to one, so that a corresponding one of the fan controllers FCB1-FCB8 can identify the servers S1-S40 connected/linked to different second bus ports P11-P85 through the second bus ports P11-P85. As such, even without using the hardware, the rack management controller 110 can also identify the different internal devices (e.g., the server or the fan controller) of the rack server system, so as to achieve the positioning function.

The sequence of the steps stated in the above embodiments can be adjusted according to actual demands, or even all or parts of the steps can be performed simultaneously, unless otherwise the sequences are stated clearly.

Although the invention has been disclosed with reference to the above embodiments, these embodiments are not intended to limit the invention. It will be apparent to those of skills in the art that various modifications and variations can be made without departing from the spirit and scope of the invention. Therefore, the scope of the invention shall be defined by the appended claims.

What is claimed is:
1. A rack server system, comprising:
a rack;
a rack management controller comprising a plurality of different first bus ports;
a plurality of server groups, each server group comprising a plurality of servers;
a plurality of fan modules, each fan module operative to dissipate heat for one of the server groups; and
a plurality of fan controllers, each fan controller collecting running information of servers in a corresponding one of the server groups and controlling an operation of a corresponding one of the fan modules accordingly, and each fan controller comprising a plurality of different second bus ports;

wherein in each of the server groups, each of the servers is connected to one of the second bus ports of a corresponding fan controller through one of second buses, the servers communicating with the corresponding fan controller using a same second bus address, each of the second bus ports corresponds to a different server position in the rack, wherein the fan controllers communicate with the servers through the second bus ports and acquire server local positions in the rack of the servers in the server group by a difference between the second bus ports through which the communication data is transmitted;

wherein each of the fan controllers is connected to one of the first bus ports through one of first buses, the fan controllers communicating with the rack management controller using a same first bus address, and each of the first bus ports corresponds to a different fan controller position in the rack, wherein the rack management controller communicate with the fan controllers through the first bus ports, acquire fan controller positions in the rack of the fan controllers through a difference between the first bus ports through which the communication data is transmitted, and acquire server local positions in the rack of the servers from the fan controllers, so as to acquire the server general positions in the rack of the servers.

2. The rack server system of claim 1, wherein the rack comprises a plurality of rack layers, each of the rack layers correspond to one of the servers, the rack layers corresponding to the servers in the same server group are adjacent to each other, one of the fan controllers corresponding to one of the server groups collects running information of the servers of the one of the server groups through the corresponding second buses to control a corresponding fan module to dissipate heat for the space of the rack layers corresponding to the servers of the one of the server groups, and the one of the fan controllers acquires the server local positions in the rack of the servers of the one of the server groups sending the running information thereof through the second bus ports through which the running information of the servers of the one of the server groups passes.

3. The rack server system of claim 2, wherein the server positions in the rack correspond to the rack layers; each of the rack layers corresponds to one of the second bus ports; the rack management controller allocates server serial numbers to the second bus ports according to the rack layers correspond to the second bus ports; and when one of the server is connected to one of the second bus port through a corresponding second bus, the corresponding fan controller assigns a corresponding server serial number to the one of the server.

4. The rack server system of claim 2, wherein the fan controllers further transmit the running information of the servers and the server local positions in the rack of the servers to the rack management controller through the first buses; the rack management controller acquires one of the fan controller positions in the rack of one of the fan controllers sending the running information and the server local positions in the rack of corresponding servers according to a corresponding first bus port through which the running information and the server local positions in the rack of the corresponding servers pass.

5. The rack server system of claim 4, wherein the rack management controller sequentially allocates a plurality of fan controller serial numbers to the fan controllers connected with the first bus ports according to a connection between the fan controllers and the first bus ports.

6. An operating method of a rack server system, comprises:
providing a rack, comprising a plurality of fan controller positions and a plurality of server positions;
providing a rack management controller comprising a plurality of different first bus ports;
defining each first bus port associated separately with one of the fan controller positions in the rack;
providing a plurality of server groups, set in these server positions, each server group comprising a plurality of servers;
providing a plurality of fan modules, each fan module operative to dissipate heat for one of the server groups;
providing a plurality of fan controllers, set in these fan controller positions, each fan controller collecting running information of servers in a corresponding one of the server groups and controlling an operation of a corresponding one of the fan modules accordingly, and each fan controller comprising a plurality of different second bus ports;
defining each second bus port associated separately with one of the server positions in the rack;
linking the second bus ports of each fan controller with the servers in a corresponding one of the server groups, separately through a second bus according to the defined association;
communicating, using the fan controllers, with the servers through the second bus ports and the fan controllers;
acquiring, using the fan controllers, server local positions in the rack of corresponding servers through the difference between the second bus ports through which the communication data is transmitted;
linking the first bus ports of the rack management controller with the fan controllers separately through a first bus according to the defined association;
communicating, using the rack management controller, with the fan controllers through the first bus ports;
acquiring, using the rack management controller, fan controller positions in the rack of the fan controllers through a difference between the first bus ports through which the communication data is transmitted; and
the rack management controller acquires the server local positions in the rack of the servers from the fan controllers and acquires the server general positions in the rack of the servers according to the fan controller positions in the rack of the fan controllers and the server local positions in the rack of the servers.

7. The operating method of claim 6, wherein the rack comprises a plurality of rack layers, each of the rack layers are corresponding to one of the servers, the rack layers corresponding to the servers of the same server group are adjacent to each other, and the operating method further comprises:
one of the fan controllers corresponding to one of the server group collects running information of the servers of the one of the server groups through the corresponding second buses to control a corresponding fan module to dissipate heat for the rack space of the rack layer corresponding to the servers of the one of the server group; and
the one of the fan controllers acquires the server local positions in the rack of the servers of the one of the server groups sending the running information thereof according to the second bus ports through which the running information of the servers of the one of the server groups passes.

8. The operating method of claim 7, wherein the server positions in the rack correspond to the rack layers, each rack layer corresponds to one of the second bus ports, and the operating method further comprises:
allocating, using the rack management controller, server serial numbers to the second bus ports according to the rack layers correspond to the second bus ports; and
when one of the servers is linked to one of the second bus ports through a corresponding second bus, the corresponding fan controller assigns the corresponding server serial number to the one of the server.

9. The operating method of claim 7, further comprising:
transmitting, using the fan controllers, the running information of the servers and the server local positions in the rack of the servers to the rack management controller through the first buses; and acquiring, using the rack management controller, one of the fan controller positions in the rack of one of the fan controllers sending the running information and the server local positions in the rack of corresponding servers according to the corresponding first bus port through which the running information and the server local positions in the rack of the corresponding servers pass.

10. The operating method of claim 9, further comprising:
sequentially allocating, using the rack management controller, a plurality of fan controller serial numbers to the fan controllers linked with the first bus ports according to a connection between the fan controllers and the first bus ports.

* * * * *